United States Patent
Lim

(10) Patent No.: US 11,243,247 B2
(45) Date of Patent: Feb. 8, 2022

(54) DEVICE AND METHOD FOR TESTING SEMICONDUCTOR DEVICE AND TEST HANDLER

(71) Applicant: SAMSUNG ELECTRONICS CO., LTD., Suwon-si (KR)

(72) Inventor: Tae Youn Lim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 138 days.

(21) Appl. No.: 16/408,907

(22) Filed: May 10, 2019

(65) Prior Publication Data

US 2020/0132753 A1 Apr. 30, 2020

(30) Foreign Application Priority Data

Oct. 24, 2018 (KR) .......................... 10-2018-0127204

(51) Int. Cl.
*G01R 31/28* (2006.01)
*G01R 1/04* (2006.01)

(52) U.S. Cl.
CPC ....... *G01R 31/2863* (2013.01); *G01R 1/0466* (2013.01); *G01R 31/2867* (2013.01)

(58) Field of Classification Search
CPC ............ G01R 31/2863; G01R 31/2867; G01R 1/0466
See application file for complete search history.

(56) References Cited

U.S. PATENT DOCUMENTS

| 6,043,442 A * | 3/2000 | Park ....................... G01R 31/68 209/573 |
| 6,219,908 B1 * | 4/2001 | Farnworth ........... G01R 1/0433 257/E21.509 |
| 6,683,449 B1 * | 1/2004 | Bell ..................... H01L 23/4093 257/718 |
| 6,853,207 B2 * | 2/2005 | Renfrow ............ G01R 31/2886 324/538 |
| 7,183,775 B2 * | 2/2007 | Durham .................. H01L 22/34 257/E23.086 |
| 7,262,615 B2 | 8/2007 | Cheng et al. |
| 8,159,244 B2 * | 4/2012 | Vaccani ............. G01R 31/2808 324/754.01 |
| 8,603,840 B2 | 12/2013 | Matsuhashi et al. |

(Continued)

FOREIGN PATENT DOCUMENTS

| JP | 2007-163463 | 6/2007 |
| JP | 2010-127740 | 6/2010 |
| KR | 10-2003-0059992 | 7/2003 |

(Continued)

*Primary Examiner* — Paresh Patel
(74) *Attorney, Agent, or Firm* — F. Chau & Associates, LLC

(57) ABSTRACT

A device for testing a semiconductor device includes a blade, a socket, and a test board. The blade includes one or more outer blade conductors disposed on one or more side surfaces of the blade. The socket includes one or more outer socket conductors disposed on one or more side surfaces of the socket. The one or more outer socket conductors are disposed at a location such that they are in contact with or are isolated from the one or more outer blade conductors depending on a position of the blade. The test board transfers a test signal to the one or more outer socket conductors.

20 Claims, 19 Drawing Sheets

(56) References Cited

U.S. PATENT DOCUMENTS

2014/0218061 A1   8/2014   Detofsky et al.

FOREIGN PATENT DOCUMENTS

| KR | 10-2015-0117732 | 10/2015 |
| KR | 10-2017-0051761 | 5/2017 |
| KR | 10-1792807 | 10/2017 |
| KR | 20-2018-0062880 | 6/2018 |

* cited by examiner

DEVICE AND METHOD FOR TESTING SEMICONDUCTOR DEVICE AND TEST HANDLER

CROSS-REFERENCE TO RELATED APPLICATIONS

This application claims priority under 35 U.S.C. § 119 to Korean Patent Application No. 10-2018-0127204 filed on Oct. 24, 2018 in the Korean Intellectual Property Office, the disclosure of which is herein incorporated by reference in its entirety.

TECHNICAL FIELD

Exemplary embodiments of the present inventive concept relate to a device and a method for testing a semiconductor device and a test handler, and more particularly, to a device for testing a semiconductor device, a method for testing a semiconductor device, and a test handler to easily check a state of contact between the semiconductor device and a test board during a process of manufacturing the semiconductor device.

DISCUSSION OF THE RELATED ART

A variety of semiconductor products including a memory such as, for example a dynamic random access memory (DRAM), a flash memory, etc., and non-memory devices such as, for example, non-memory logic devices, may go through numerous product quality verification processes depending on usage. Generally, a test process performed in a final stage of the verification process may be conducted by semiconductor test equipment such as a test handler, a tester, etc. The test handler may provide support for testing a semiconductor device manufactured through a certain manufacturing process, and semiconductor devices may be classified by grades in accordance with a test result.

To test a semiconductor device, the test handler may perform an operation for connecting the semiconductor device to a test board. The test hander may be a handling device which provides an appropriate temperature and condition for testing a device or a module, moves the semiconductor device or module to a position in which the semiconductor device or module is to be automatically tested using an electrical test, automatically inserts the device or module into or removes the device or module from a socket electrically connected to a tester, communicates with the tester and determines whether the device or module has defects in accordance with the test result, automatically classifies the device or module by grade, and stores the device or module, in relation to a process of testing a semiconductor device.

As semiconductor process technology advances, memory devices have a relatively higher integration density. As a result, it may be more difficult to implement the process of testing a semiconductor device.

SUMMARY

Exemplary embodiments of the present inventive concept provide a device for testing a semiconductor device, a method of testing a semiconductor device, and a test handler capable of efficiently checking a state of contact between the semiconductor device and a test board during a process of manufacturing the semiconductor device.

According to an exemplary embodiment, a device for testing a semiconductor device includes a blade, a socket, and a test board. The blade includes one or more outer blade conductors disposed on one or more side surfaces of the blade. The socket includes one or more outer socket conductors disposed on one or more side surfaces of the socket. The one or more outer socket conductors are disposed at a location such that they are in contact with or are isolated from the one or more outer blade conductors depending on a position of the blade. The test board transfers a test signal to the one or more outer socket conductors.

According to an exemplary embodiment, a test handler includes a blade movable from a first position to a second position, and one or more outer blade conductors formed on at least one side surface of the blade. While the blade is moved from the first position to the second position, the one or more outer blade conductors indicate whether a test process is continued, depending on whether a test signal is transferred from one or more outer socket conductors formed on outer regions of a socket.

According to an exemplary embodiment, a method of testing a semiconductor device includes a first process of moving a blade comprising one or more outer blade conductors disposed on one or more side surfaces of the blade from a first position to a second position, a second process of determining whether a test signal is transferred from one or more outer socket conductors formed on one or more outer regions of a socket to the one or more outer blade conductors, and a third process of determining whether an error is detected based on whether the test signal is transferred from the one or more outer socket conductors to the one or more outer blade conductors.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
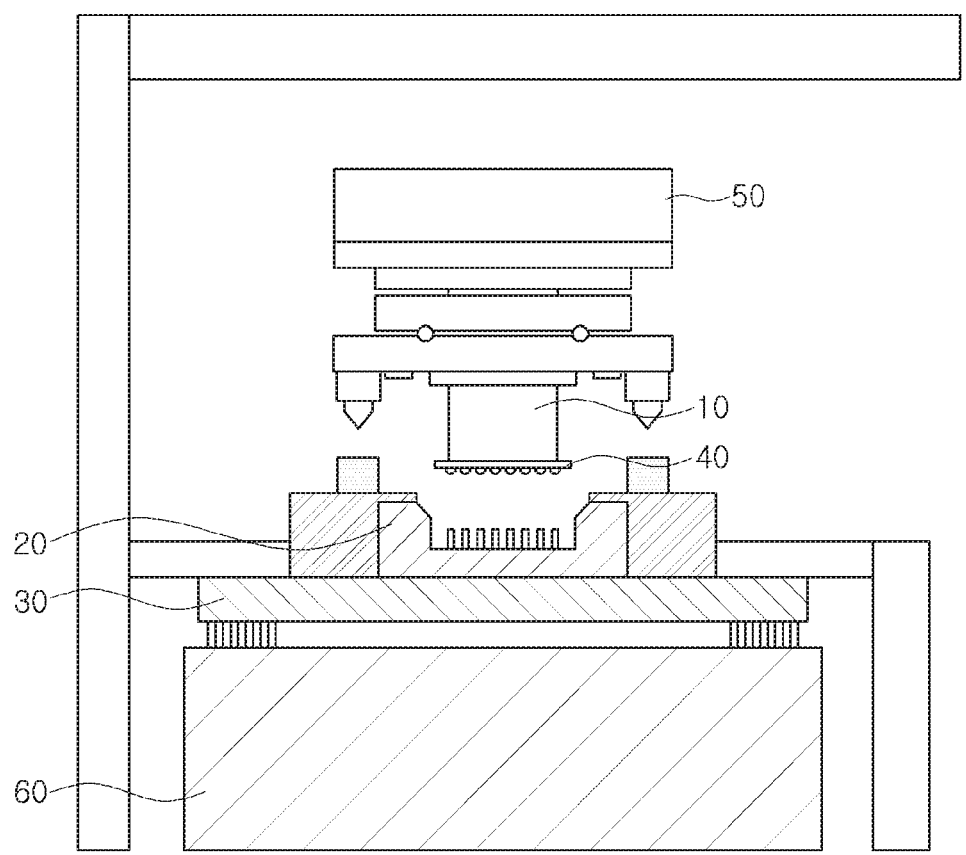
FIG. 1 is a side view illustrating a test handler and a tester for performing a process of testing a semiconductor device.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

Figure 2:
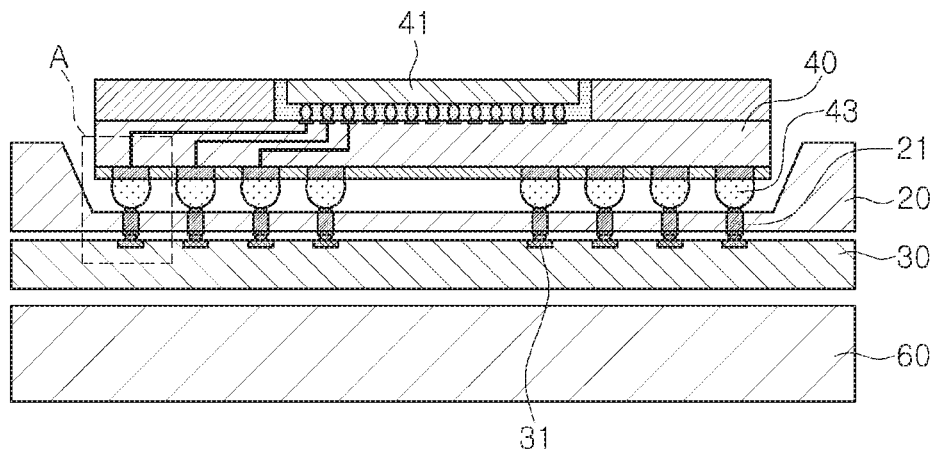
FIG. 2 is a lateral cross-sectional view illustrating a state in which a semiconductor device, a socket, and a test board are in contact with one another.
Figure 3:
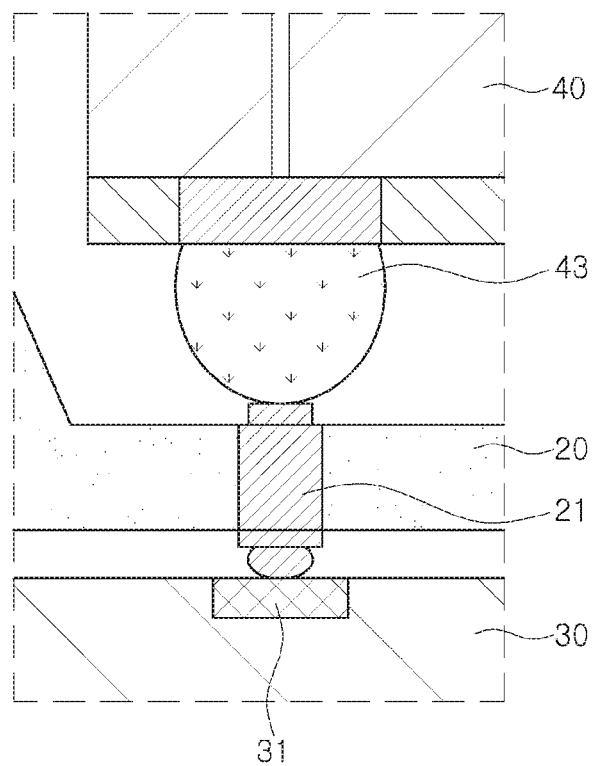
FIG. 3 is a diagram illustrating portion A illustrated in FIG. 2.

FIG. 1 is a side view illustrating a test handler and a tester for performing a process of testing a semiconductor device. FIG. 2 is a lateral cross-sectional view illustrating a state in which a semiconductor device, a socket, and a test board are in contact with one another. FIG. 3 is a diagram illustrating portion A in FIG. 2.

A process of testing a semiconductor device is performed to determine whether a semiconductor device or a module (e.g., an object of the test) has defects, and to classify the semiconductor device in accordance with the test result. Thus, a test handler, a socket connecting the semiconductor device and a test board, and the test board may need to be connected in a precise manner. If these components are not connected in a precise manner, even when a semiconductor device does not have defects, the test handler and a tester may erroneously determine that the semiconductor device has defects.

As advancements are made in semiconductor process technology, a memory device has higher integration density. As a result, it may be more difficult to precisely connect the semiconductor device, a socket, and the test board to one another. Process errors occurring among the elements may be caused for various reasons. For example, the elements may not be properly in contact with one another as pressure applied after the test handler moves the semiconductor device downwardly is lower than a predetermined level. Also, errors occurring when a blade is manufactured and mounted, errors between the blade and the socket, errors occurring when the test board and the socket are manufactured and assembled, etc., may cause contact errors between the elements.

For example, referring to FIG. 1, a test handler 50 may allow a test object (e.g., a semiconductor device 40) to be in contact with a socket 20, as illustrated in FIG. 2, by applying an appropriate level of pressure after the test handler 50 moves a blade 10 downwardly. As illustrated in FIG. 3, a result of the test process for the semiconductor device may be reliable when terminals 43 included in the semiconductor device 40 (or a module), terminals 21 mounted on the socket 20, and terminals 31 disposed on a test board 30 are properly in contact with one another. However, if the terminals 43, the terminals 21 and the terminals 31 are not properly in contact with one another, which may occur as the result of various errors as described above, reliability of the results of the process of testing the semiconductor device may be reduced.

To efficiently determine whether the elements are properly in contact with one another, a device for testing a semiconductor device may include a blade including at least one or more outer blade conductors disposed on side surfaces of the blade, a socket including at least one or more outer socket conductors to be in contact with or to be isolated from (e.g., separated from) the outer blade conductors depending on a position of the blade on side surfaces of the socket, and a test board that transfers a test signal to the outer socket conductors. In the description below, these elements will be described in greater detail when describing exemplary embodiments. The outer blade conductors may be selectively removable from the blade.

Figure 4:
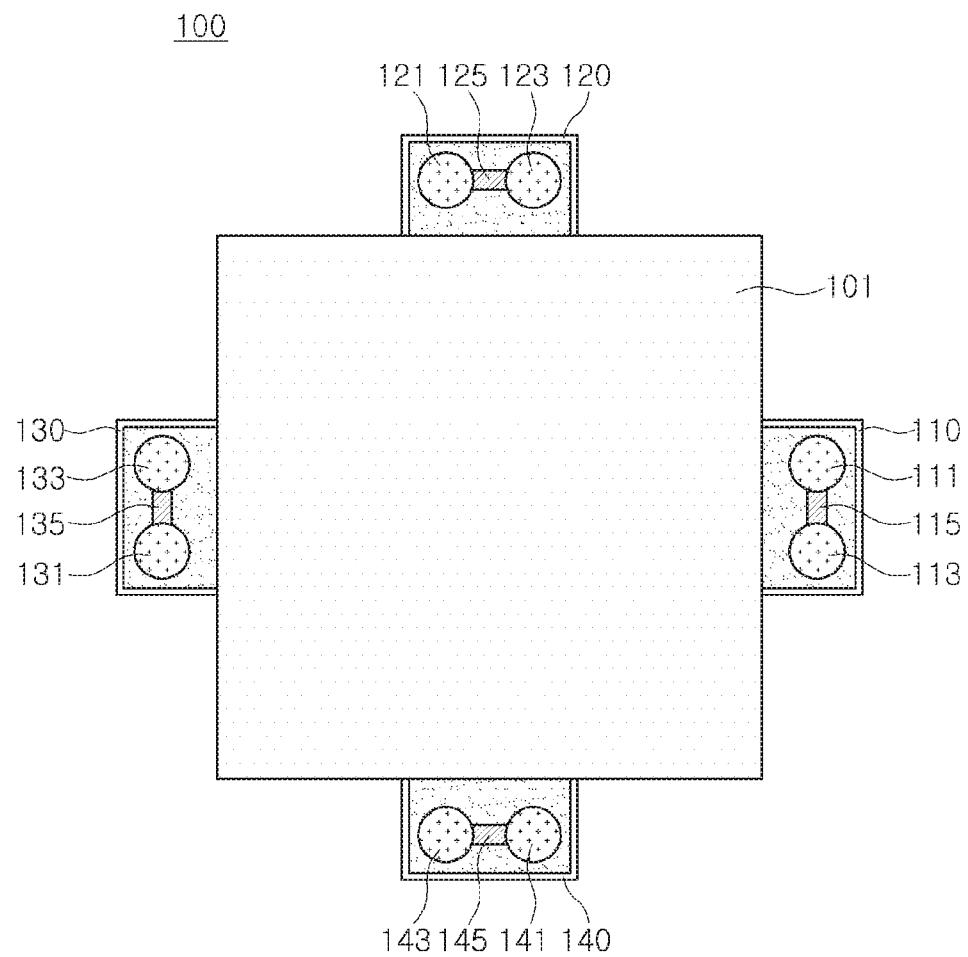
FIG. 4 is a schematic plan view illustrating a blade of a device for testing a semiconductor device according to an exemplary embodiment.
Figure 5:
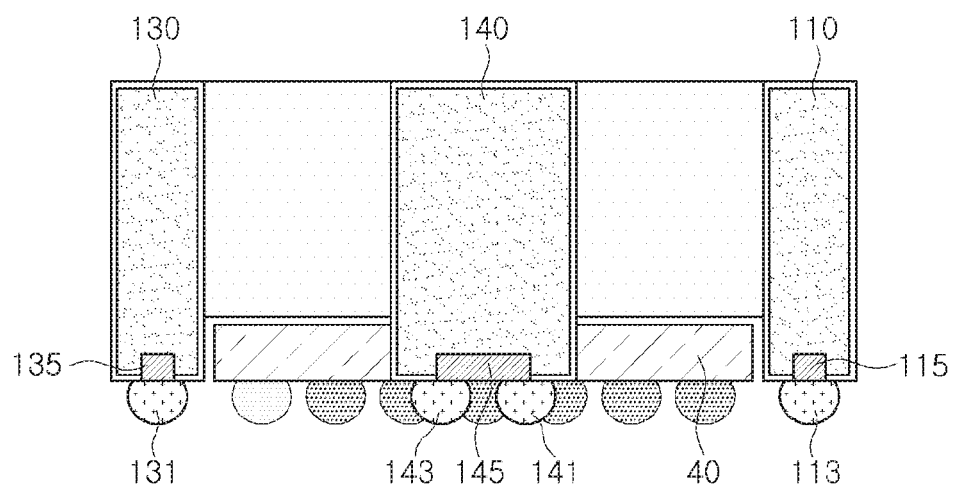
FIG. 5 is a side view illustrating the blade of FIG. 4.
Figure 6:
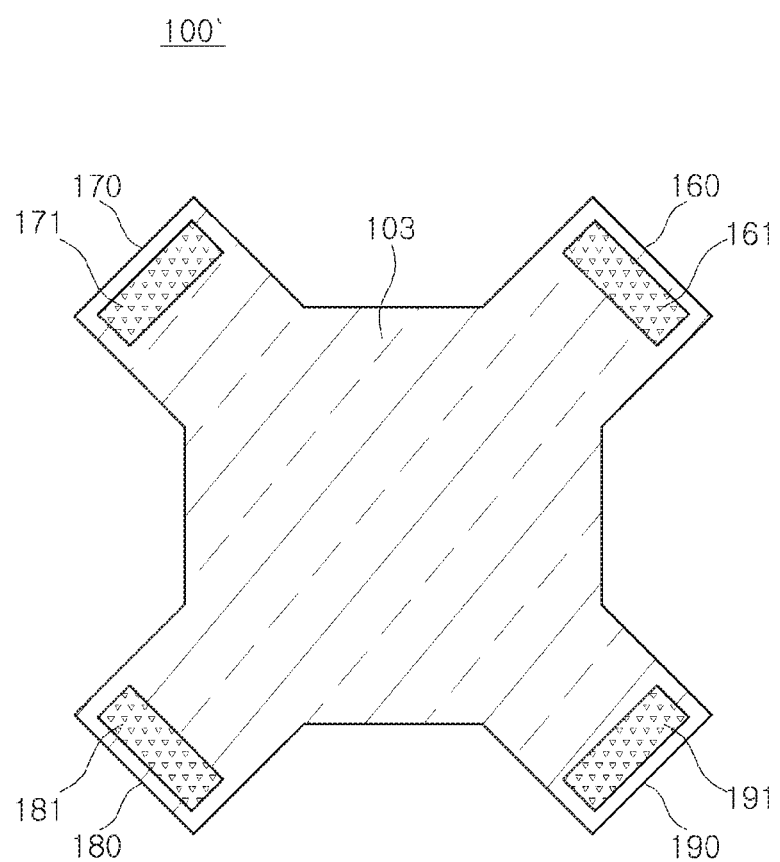
FIG. 6 is a schematic plan view illustrating a blade of a device for testing a semiconductor device according to an exemplary embodiment.
Figure 7:
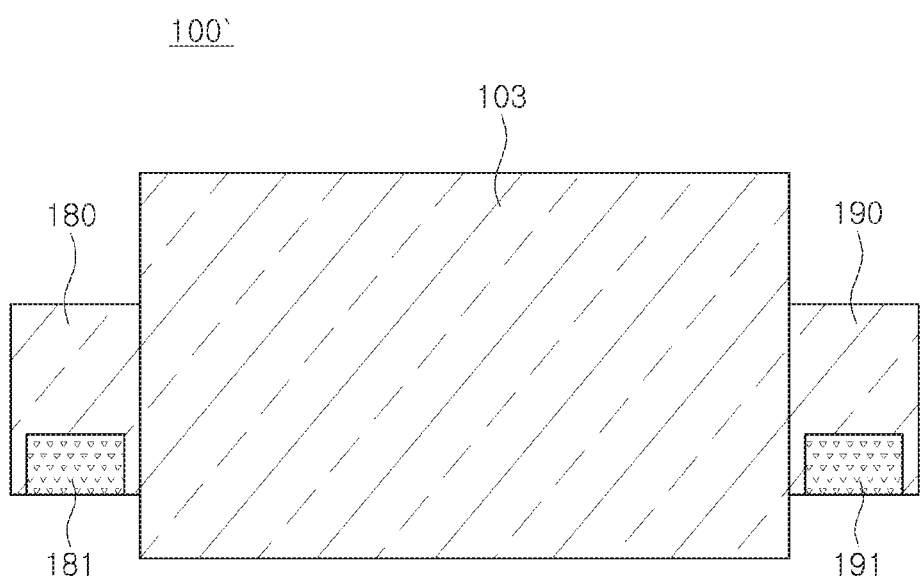
FIG. 7 is a side view illustrating the blade of FIG. 6.

FIG. 4 is a schematic plan view illustrating a blade of a device for testing a semiconductor device according to an exemplary embodiment. FIG. 5 is a side view illustrating the blade of FIG. 4. FIG. 6 is a schematic plan view illustrating a blade of a device for testing a semiconductor device according to an exemplary embodiment. FIG. 7 is a side view illustrating the blade of FIG. 6.

FIGS. 4 to 7 illustrate an example in which the blade has a rectangular shape. However, the shape of the blade is not limited thereto.

In exemplary embodiments, the blade has a cross-sectional surface having a rectangular shape taken in a direction perpendicular to a direction in which the blade is moved from a first position (e.g., a position in which the device for testing the semiconductor device is not ready to test the semiconductor device) to a second position (e.g., a position in which the device for testing the semiconductor device is ready to test the semiconductor device).

It will be understood that the terms "first," "second," "third," etc. are used herein to distinguish one element from another, and the elements are not limited by these terms. Thus, a "first" element in an exemplary embodiment may be described as a "second" element in another exemplary embodiment.

In exemplary embodiments, a blade may include at least one or more outer blade conductors disposed on side surfaces of the blade. For example, in FIGS. 4 and 5, outer blade conductors 111, 113, 121, 123, 131, 133, 141, and 143 of a blade 100 are formed on four edges of a blade body 101 forming the rectangular shape. In FIGS. 6 and 7, outer blade conductors 161, 171, 181, and 191 of a blade 100' are formed on four protrusions 160, 170, 180, and 190 respectively disposed at four corners of a blade body 103 forming the rectangular shape.

As illustrated in FIGS. 4 and 5, in an exemplary embodiment, the outer blade conductors 111, 113, 121, 123, 131, 133, 141, and 143 of the blade 100 may have ball forms which are electrically connected to one another. For example, the outer blade conductors 111 and 113 may be electrically connected to each other via an electrically conductive element 115 (e.g., a wire), the outer blade conductors 121 and 123 may be electrically connected to each other via an electrically conductive element 125 (e.g., a wire), the outer blade conductors 131 and 133 may be electrically connected to each other via an electrically conductive element 135 (e.g., a wire), and the outer blade conductors 141 and 143 may be electrically connected to each other via an electrically conductive element 145 (e.g., a wire).

As illustrated in FIGS. 4 and 5, in an exemplary embodiment, the outer blade conductors 111, 113, 121, 123, 131, 133, 141, and 143 may be configured to have package forms 110, 120, 130, and 140 to be able to be separated from and coupled to a blade body 101 if desired. For example, the outer blade conductors 110 and 113 may be included in a package 110, the outer blade conductors 121 and 123 may be included in a package 120, the outer blade conductors 130 and 131 may be included in a package 130, and the outer blade conductors 141 and 143 may be included in a package 140. Each of the packages 110, 120, 130, and 140 may be selectively coupled to and decoupled from the blade body 101.

As illustrated in FIGS. 6 and 7, in an exemplary embodiment, the outer blade conductors 161, 171, 181, and 191 of the blade 100' may have pad forms 161, 171, 181, and 191.

According to exemplary embodiments, the ball forms and/or the package forms illustrated in FIGS. 4 and 5 may be utilized with the blade 100' illustrated in FIGS. 6 and 7, and the pad forms illustrated in FIGS. 6 and 7 may be utilized with the blade 100 illustrated in FIGS. 4 and 5.

Figure 8:
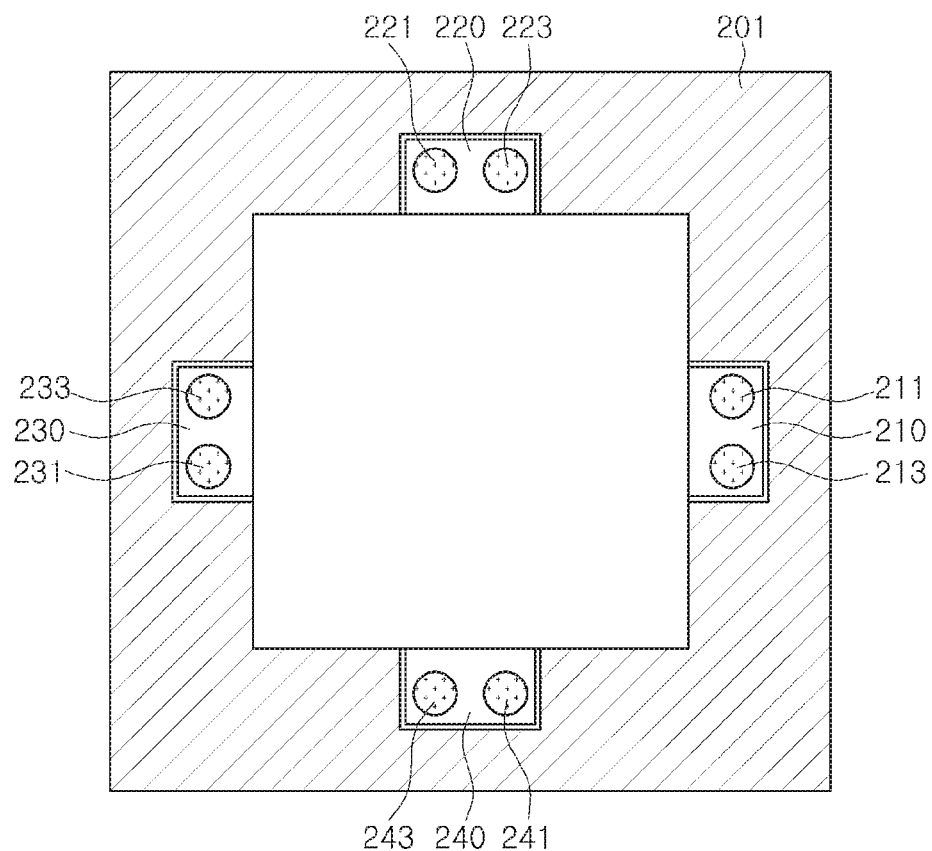
FIG. 8 is a schematic plan view illustrating a socket of a device for testing a semiconductor device according to an exemplary embodiment.
Figure 9:
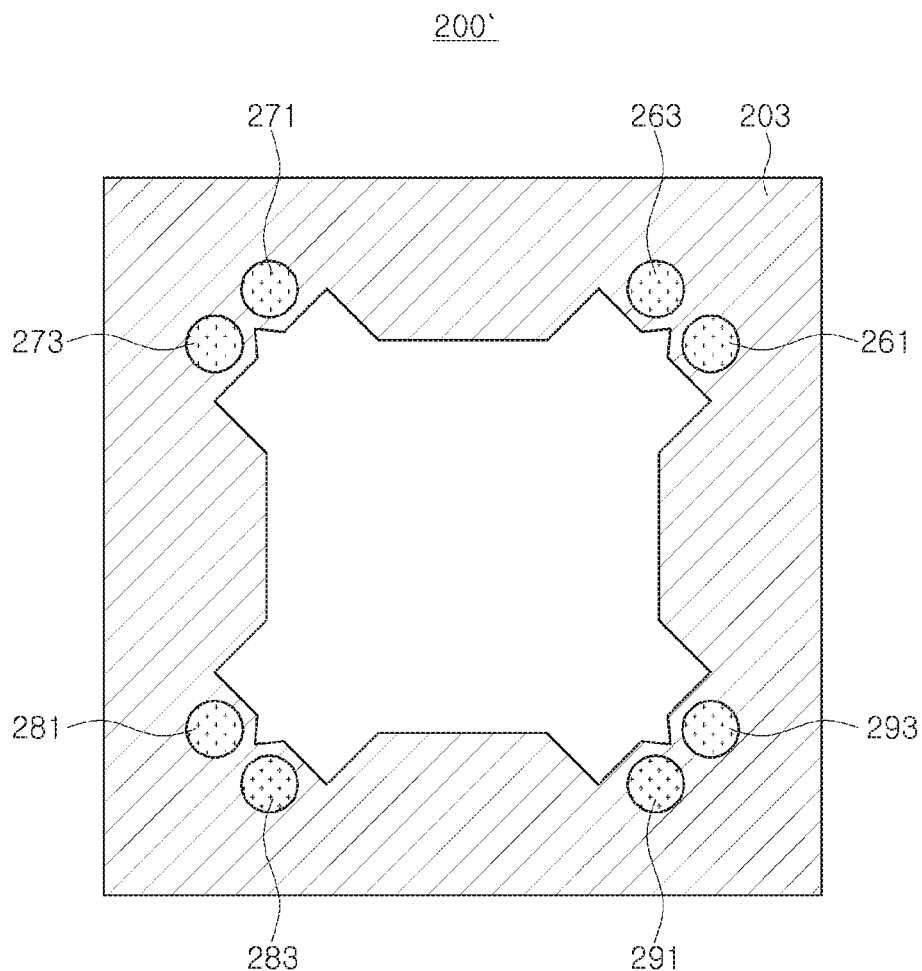
FIG. 9 is a schematic plan view illustrating a socket of a device for testing a semiconductor device according to an exemplary embodiment.
Figure 10:
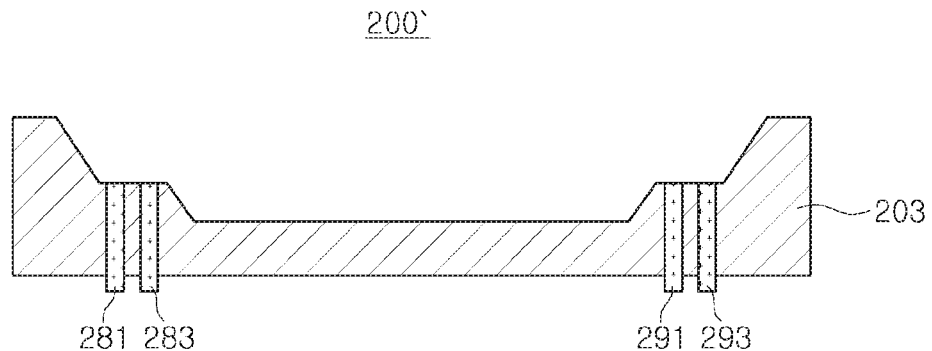
FIG. 10 is a lateral cross-sectional view illustrating the socket of FIG. 9.

FIG. 8 is a schematic plan view illustrating a socket of a device for testing a semiconductor device according to an exemplary embodiment. FIG. 9 is a schematic plan view illustrating a socket of a device for testing a semiconductor device according to an exemplary embodiment. FIG. 10 is a lateral cross-sectional view illustrating the socket of FIG. 9.

Referring to FIG. 8, in an exemplary embodiment, a socket 200 is designed to conform to a shape of the blade 100 illustrated in FIGS. 4 and 5. The socket 200 may include at least one or more sub-conductors 211, 213, 221, 223, 231, 233, 241, and 243 that form outer socket conductors 210, 220, 230, and 240 and that are configured to be in contact with or to be isolated from (e.g., separate from, with a distance existing therebetween) the outer blade conductors 111, 113, 121, 123, 131, 133, 141, and 143 of the blade 100 depending on a position of the blade 100 (see FIGS. 4 and 5). Referring to FIG. 9, in an exemplary embodiment, a socket 200' is designed to conform to a shape of the blade 100' illustrated in FIGS. 6 and 7. The socket 200' may include at least one or more sub-conductors 261, 263, 271, 273, 281, 283, 291, and 293 that form outer socket conductors and that are configured to be in contact with or to be isolated from the outer blade conductors 161, 171, 181, and 191 of the blade 100' depending on a position of the blade 100' (see FIGS. 6 and 7). As the number and/or positions of the outer blade conductors disposed on side surfaces of the blade 100 or the blade 100' may change, the number and/or positions of the outer socket conductors (and the sub-conductors) formed on the socket 200 or the socket 200' may also be changed accordingly.

The outer socket conductors may each include a first sub-conductor and a second sub-conductor isolated from each other. For example, referring to the socket 200 illustrated in FIG. 8, in one outer socket conductor 210, a first sub-conductor 211 and a second sub-conductor 213 are formed and isolated from each other. Similarly, the other outer socket conductors 220, 230, and 240 illustrated in FIG. 8 may respectively include first sub-conductors 221, 231, and 241 and second sub-conductors 223, 233, and 243 isolated from each other. Referring to the socket 200' illustrated in FIG. 9, in an exemplary embodiment, the outer socket conductors may respectively include first sub-conductors 261, 271, 281, and 291 and second sub-conductors 263, 273, 283, and 293 isolated from each other, in which only positions of the outer socket conductors may be different from the exemplary embodiment illustrated in FIG. 8.

The outer socket conductors may be embedded in a housing 201 of the socket 200 as illustrated in FIG. 8 and a housing 203 of the socket 200' as illustrated in FIG. 9, and only some of the outer socket conductors may be exposed to an upper portion and a lower portion of the socket 200/200' to be in contact with the semiconductor device 40 and the test board (e.g., the test boards 300, 300', 300'', and 300''' described below with reference to FIGS. 11 to 14). Accordingly, the first sub-conductors may be configured to receive a test signal from the test board, and the second sub-conductors may be configured to provide a test signal to the test board.

Figure 11:
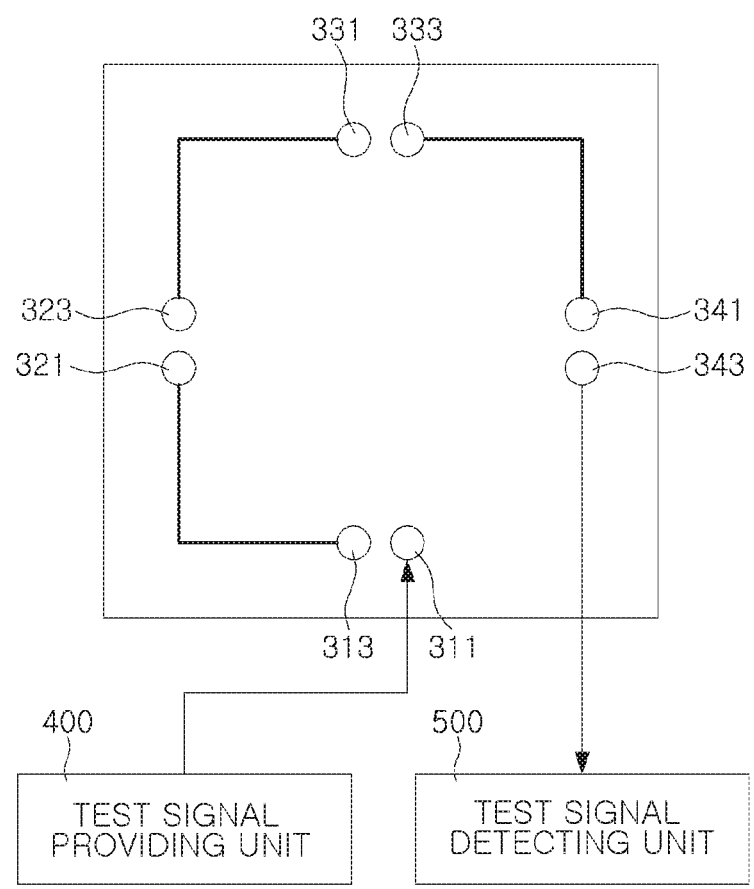
FIG. 11 is a schematic plan view illustrating a test board of a device for testing a semiconductor device according to an exemplary embodiment.
Figure 12:
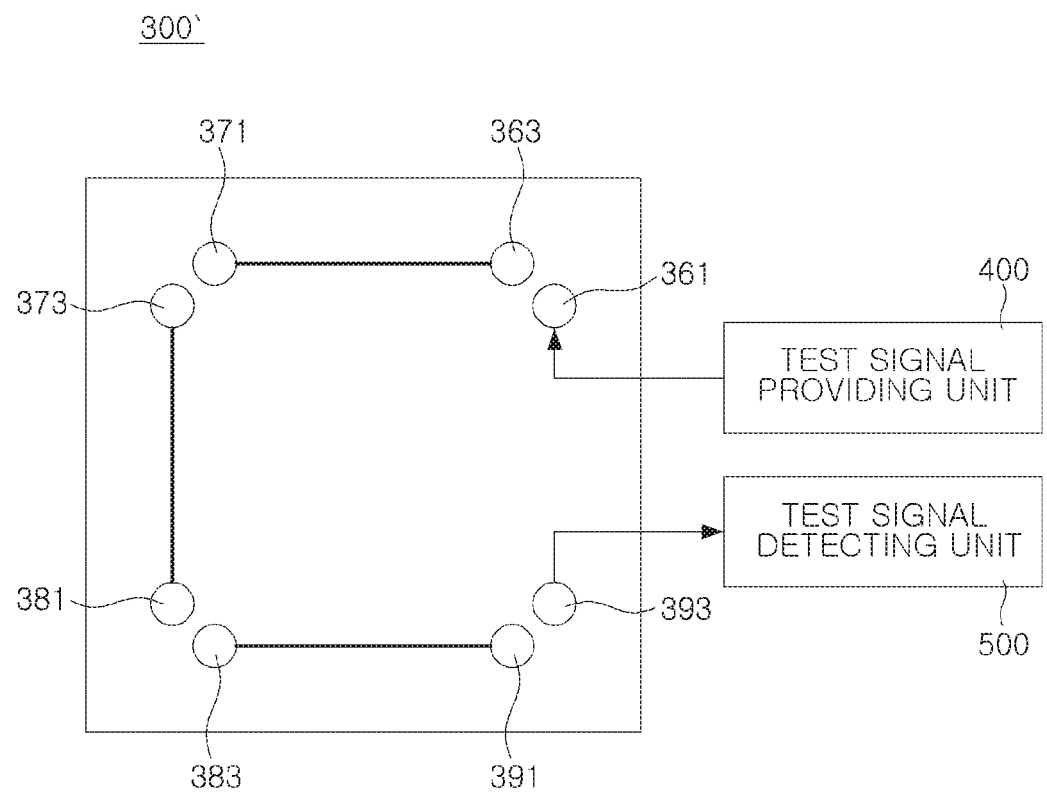
FIG. 12 is a schematic plan view illustrating a test board of a device for testing a semiconductor device according to an exemplary embodiment.
Figure 13:
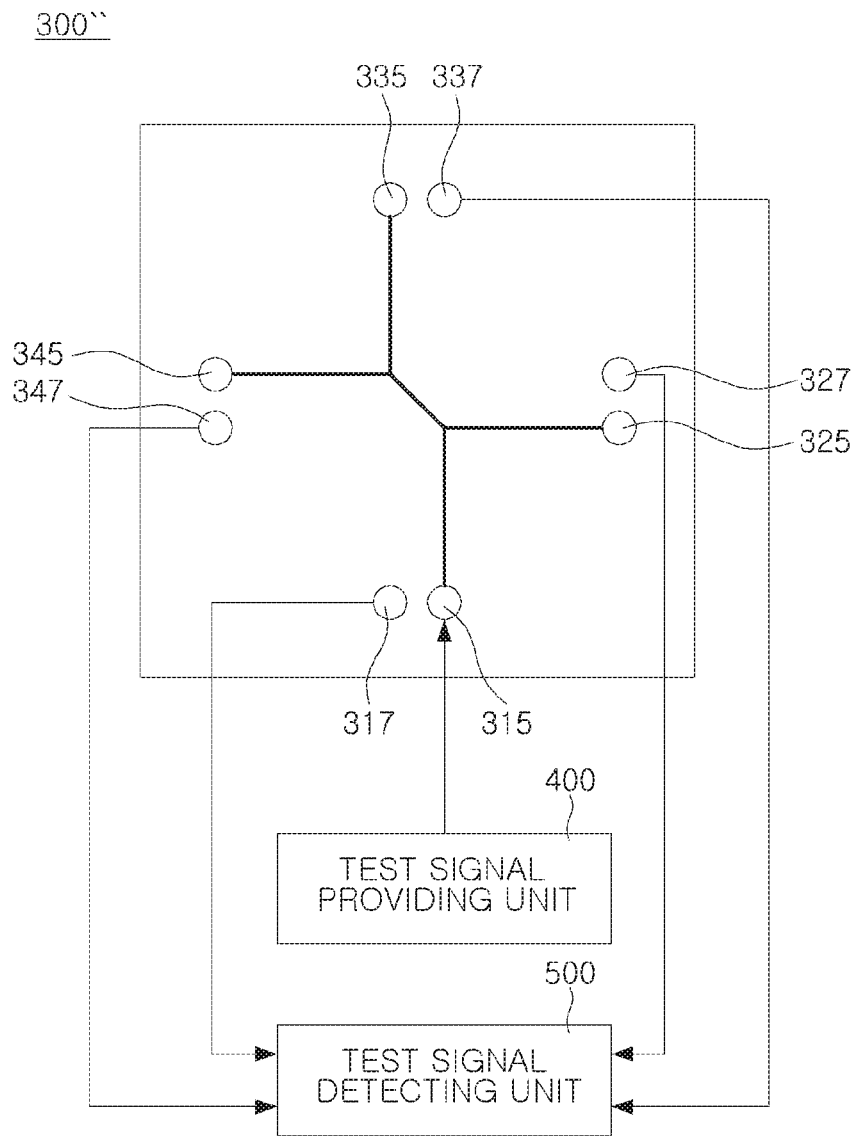
FIG. 13 is a schematic plan view illustrating a test board of a device for testing a semiconductor device according to an exemplary embodiment.
Figure 14:
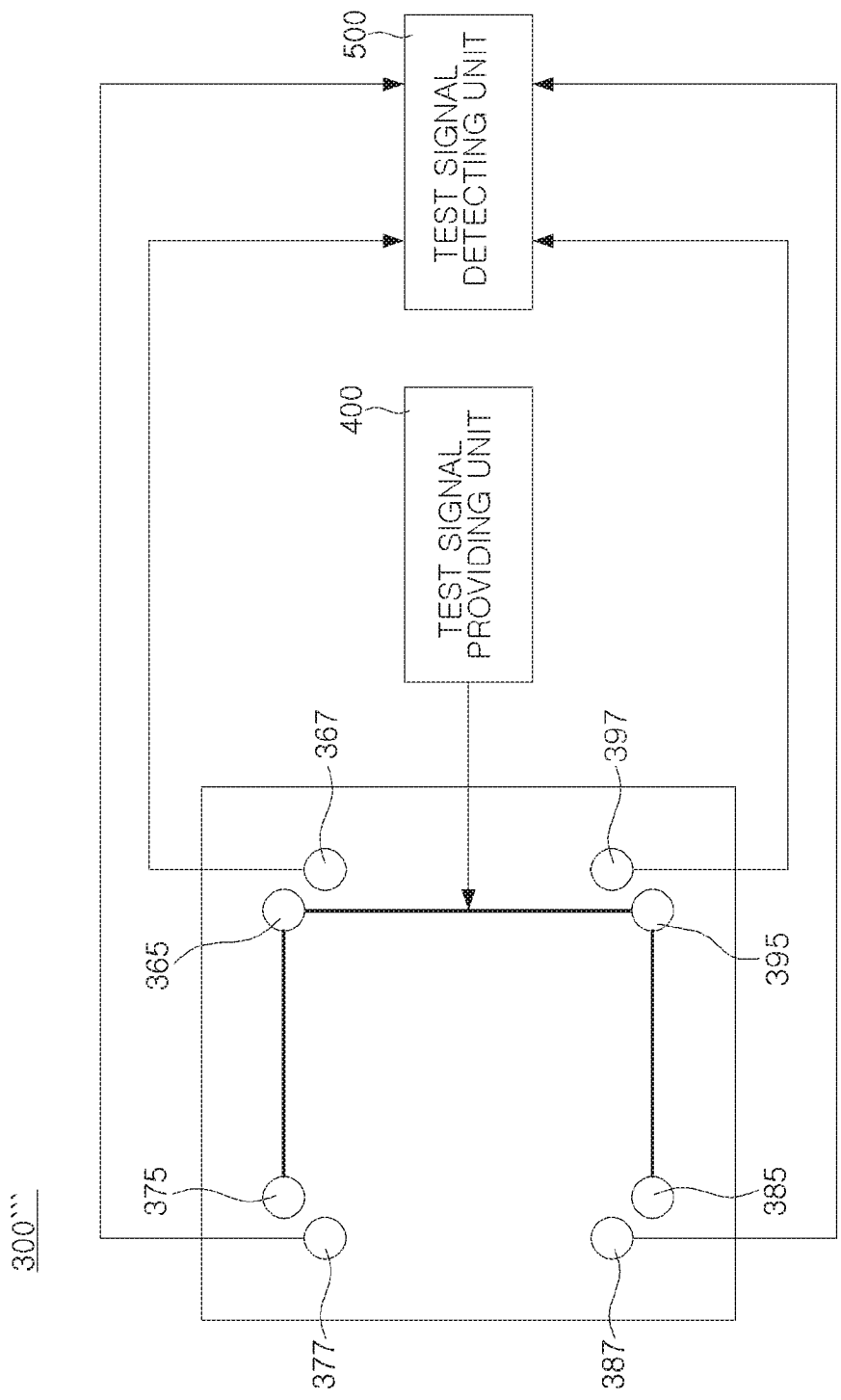
FIG. 14 is a schematic plan view illustrating a test board of a device for testing a semiconductor device according to an exemplary embodiment.

FIG. 11 is a schematic plan view illustrating a test board of a device for testing a semiconductor device according to an exemplary embodiment. FIG. 12 is a schematic plan view illustrating a test board of a device for testing a semiconductor device according to an exemplary embodiment. FIG. 13 is a schematic plan view illustrating a test board of a device for testing a semiconductor device according to an exemplary embodiment. FIG. 14 is a schematic plan view illustrating a test board of a device for testing a semiconductor device according to an exemplary embodiment.

A test board (e.g., test boards 300, 300', 300'', and 300''' illustrated in FIGS. 11 to 14) in an exemplary embodiment may transfer a test signal to outer socket conductors. A test board (e.g., test boards 300, 300', 300'', and 300''' illustrated in FIGS. 11 to 14) in an exemplary embodiment may transfer a test signal to or may receive a test signal from the outer socket conductors. To this end, the test board (e.g., test boards 300, 300', 300'', and 300''' illustrated in FIGS. 11 to 14) in an exemplary embodiment may include a signal transmitting portion that transmits a test signal to the outer socket conductors, and a signal receiving portion that receives a test signal from the outer socket conductors.

The signal transmitting portion and the signal receiving portion may be conductors formed on the test board (e.g., test boards 300, 300', 300'', and 300''' illustrated in FIGS. 11 to 14) that transfer an electrical signal. Thus, herein, the terms signal transmitting portion and signal transmitting conductor, and signal receiving portion and signal receiving conductor, may be used interchangeably. The forms of the signal transmitting portion and the signal receiving portion may include, for example, a through-hole via, a metal pad, and/or a wire connecting the through-hole via and the metal pad. Referring to the exemplary embodiment illustrated in FIG. 11, signal transmitting portions 311, 321, 331, and 341 may serve to transfer a test signal received from a test signal providing unit 400 (also referred to as a test signal providing circuit) to an outer socket conductor. The test signal providing unit 400 may be an element of a tester 60 (see FIGS. 1 and 2). However, exemplary embodiments are not limited thereto. Referring to the exemplary embodiment illustrated in FIG. 12, the test board 300' may include signal transmitting portions 361, 371, 381 and 391, and signal receiving portions 363, 373, 383 and 393.

While the blade (e.g., blades 100 and 100' illustrated in FIGS. 4 to 7) is moved from a first position (e.g., a position in which the device for testing the semiconductor device is not ready to test the semiconductor device) to a second position (e.g., a position in which the device for testing the semiconductor device is ready to test the semiconductor device) for a process of testing the semiconductor device 40, when the test signal transferred to the outer socket conductor reaches an outer blade conductor through the signal transmitting portions 311, 321, 331, and 341 as described above, it may indicate that the semiconductor device 40 (e.g., the test object) is properly in contact with the terminals (outer socket conductors) of the socket (e.g., sockets 200 and 200' illustrated in FIGS. 8 and 9) and also with signal terminals (a signal transmitting portion and/or a signal receiving portion) formed on the test board (e.g., test boards 300, 300', 300'', and 300''' illustrated in FIGS. 11 to 14). In the description below, a term "test signal transferring portion" may be used, which includes a signal transmitting portion and a signal receiving portion. Since the included signal transmitting portion and the included signal receiving portion may respectively be conductors, the test signal transferring portion may also be referred to herein as a test signal transferring conductor portion.

When the test signal transferred to the first sub-conductor of the outer socket conductor through the signal transmitting portions 311, 321, 331, and 341 reaches an outer blade conductor, and the test signal passes through the second sub-conductor of the outer socket conductor again and reaches the signal receiving portions 313, 323, 333, and 343 on the test board (e.g., test boards 300, 300', 300'', and 300''' illustrated in FIGS. 11 to 14), it may also indicate that the semiconductor device 40 (e.g., the test object), the socket (e.g., sockets 200 and 200' illustrated in FIGS. 8 and 9), and the test board (e.g., test boards 300, 300', 300'', and 300''' illustrated in FIGS. 11 to 14) are properly in contact with one another.

Exemplary embodiments of the test boards 300, 300', 300'', and 300''' in FIGS. 11 to 14 illustrate a configuration in which both the signal transmitting portion and the signal receiving portion are disposed on the test boards 300, 300', 300'', and 300''' in consideration of the exemplary embodiment in which, after the test signal transferred through the test board (e.g., test boards 300, 300', 300'', and 300''') passes through the socket (e.g., sockets 200 and 200') and reaches the blade (e.g., blades 100 and 100'), the test signal passes through the socket (e.g., sockets 200 and 200') again and returns to the test board (e.g., test boards 300, 300', 300'', and 300'''). However, as described above, even when it is detected that the test signal transferred through the test boards 300, 300', 300'', and 300''' passes through the socket (e.g., sockets 200 and 200') and reaches only the blade (e.g., blades 100 and 100'), it may be determined that the semiconductor device 40 the socket (e.g., sockets 200 and 200'), and the test board (e.g., test boards 300, 300', 300'', and 300''') are properly in contact with one another. In this case, only the signal transmitting portion may be provided in the test board (e.g., 300, 300', 300'', and 300'''), and the socket (e.g., sockets 200 and 200') may include only one conductor, rather than including a first sub-conductor and a second sub-conductor isolated from each other.

Herein, when a device for testing a semiconductor device is described as including the blade 100 of FIGS. 4 and 5, the socket 200 of FIG. 8, and/or the test board 300 of FIG. 11, it is to be understood that the device may instead include the blade 100' of FIGS. 6 and 7, the socket 200' of FIGS. 9 and 10, and/or the test board 300', 300'', and 300''' of FIGS. 12 to 14, respectively, unless the context clearly indicates otherwise.

Figure 15:
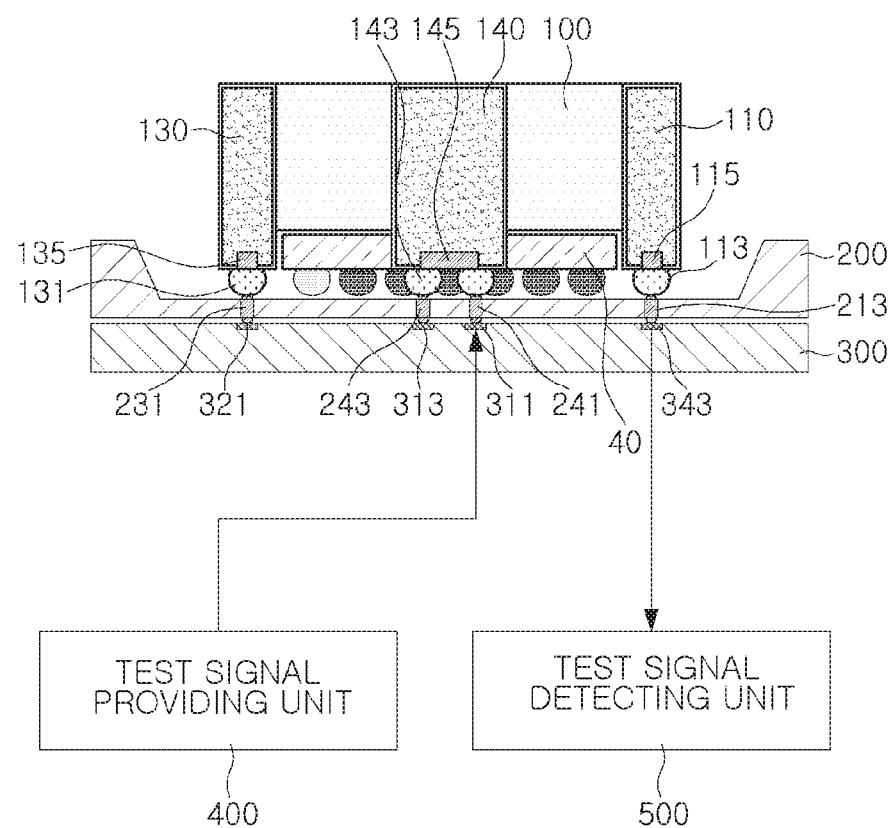
FIG. 15 is a side view illustrating a device for testing a semiconductor device according to an exemplary embodiment.
Figure 16:
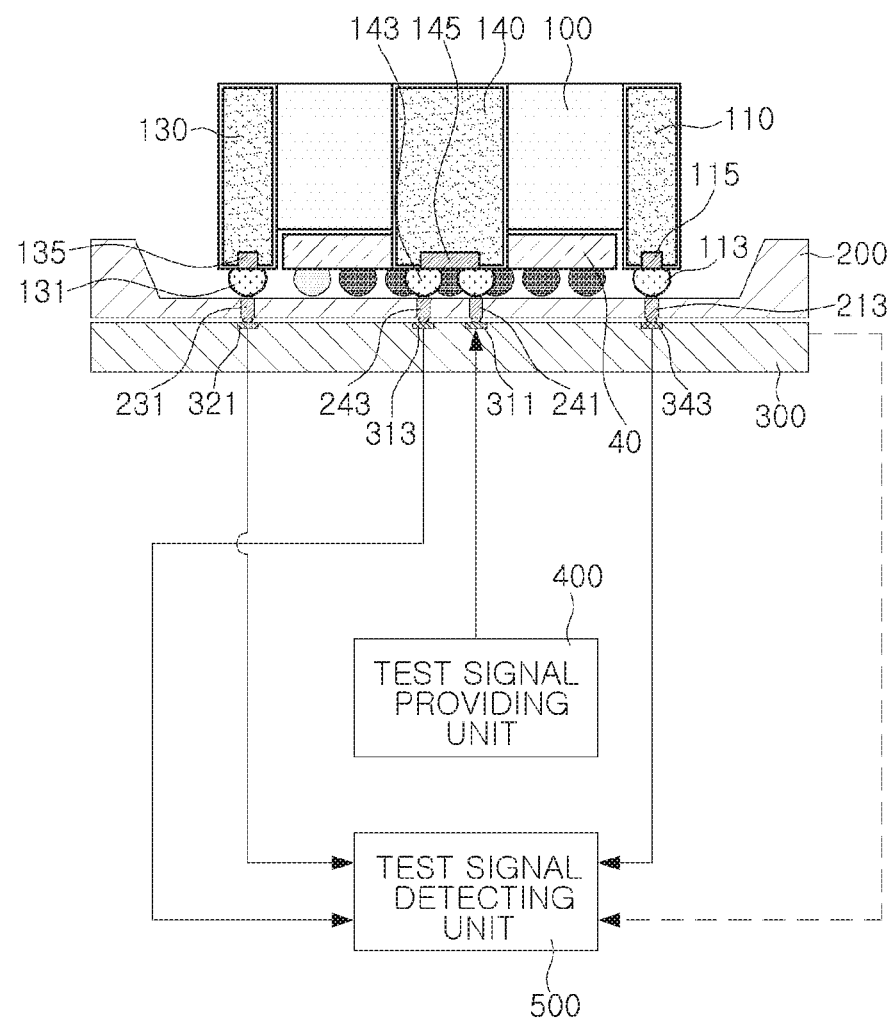
FIG. 16 is a side view illustrating a device for testing a semiconductor device according to an exemplary embodiment.
Figure 17:
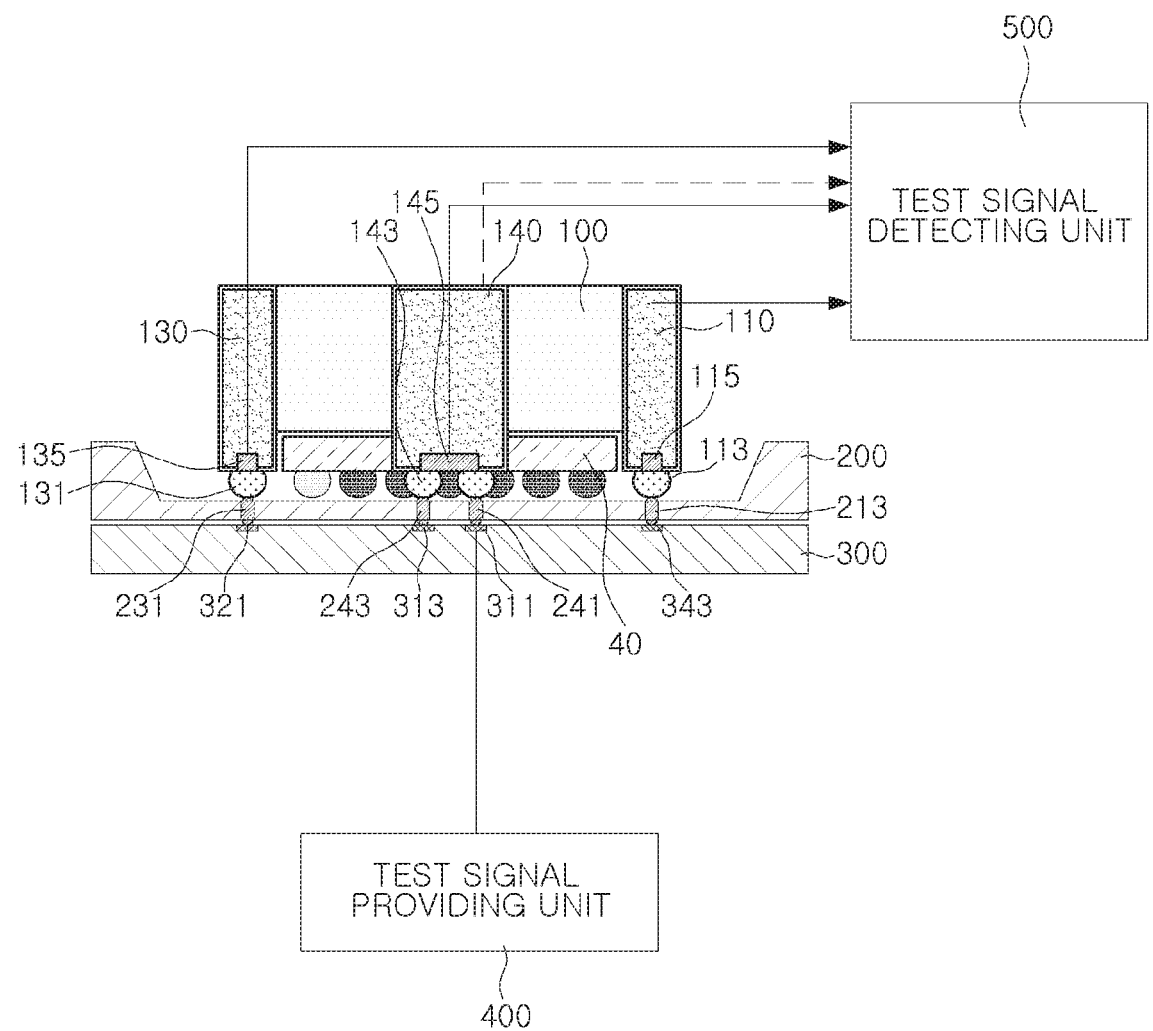
FIG. 17 is a side view illustrating a device for testing a semiconductor device according to an exemplary embodiment.

FIG. 15 is a side view illustrating a device for testing a semiconductor device according to an exemplary embodiment. FIG. 16 is a side view illustrating a device for testing a semiconductor device according to an exemplary embodiment. FIG. 17 is a side view illustrating a device for testing a semiconductor device according to an exemplary embodiment.

As described above, a device for testing a semiconductor device according to exemplary embodiments may include a blade including at least one or more outer blade conductors on side surfaces of the blade, a socket including at least one or more outer socket conductors disposed on side surfaces of the socket in positions to be in contact with or to be isolated from the outer blade conductors depending on a position of the blade, and a test board that transfers a test signal to the outer socket conductors. This configuration is illustrated in FIGS. 15 to 17, which illustrate a state in which a blade is moved from a first position to a second position in a test handler device.

Herein, the term "test handler" may be used to collectively refer to elements according to exemplary embodiments described herein including, for example, a blade (e.g., the blades 100 and 100' of FIGS. 4 to 7), a socket (e.g., the sockets 200 and 200' of FIGS. 8 to 10), a test board (e.g., the test boards 300, 300', 300'', and 300''' of FIGS. 11 to 14), a test signal providing unit 400, and/or a test signal detecting unit 500.

The device for testing a semiconductor device according to the exemplary embodiments may further include a test signal providing unit 400 (also referred to as a test signal providing circuit) that provides a test signal to the test board while the blade is moved from the first position to the second position, and a test signal detecting unit 500 (also referred to as a test signal detecting circuit) that detects whether the test signal provided from the test signal providing unit reaches the outer blade conductors, as illustrated in FIG. 17. In the exemplary embodiment of FIG. 17, it may be determined whether the elements are properly in contact with one another by detecting whether the test signal provided through the test signal providing unit 400 passes through the test board 300 and the socket 200 and reaches the blade 100. The test signal detecting unit 500 may be an element of a tester 60 (see FIGS. 1 and 2), however, exemplary embodiment are not limited thereto.

Although FIGS. 15 to 17 refer to the blade 100, the socket 200, and the test board 300, it is to be understood that the blades 100, and 100' illustrated in FIGS. 4 to 7, the test boards 300', 300'', and 300''' illustrated in FIGS. 12 to 14, and the socket 200' illustrated in FIG. 9 may be implemented in FIGS. 15 to 17.

The test signal providing unit 400 may provide a test signal to the test board 300 while the blade 100 is moved from a first position to a second position, and the test signal detecting unit 500 may detect whether the test signal provided from the test signal providing unit 400 reaches a signal receiving portion, as illustrated in FIGS. 15 and 16. In the exemplary embodiments of FIGS. 15 and 16, whether the elements are properly in contact with one another may be determined by detecting whether, after the test signal provided through the test signal providing unit 400 passes through the test board 300 and the socket 200 and reaches the blade 100, the test signal passes through the socket 200 again and returns to the test board 300.

As described above, the number of outer blade conductors, the number of outer socket conductors, and the number of test signal transferring portions may be one, or may be two or more. A plurality of outer blade conductors, a plurality of outer socket conductors, and a plurality of test signal transferring portions may be provided on outer regions of the elements on which they are disposed, and the more uniformly disposed the above described components, the higher the reliability of the test of the semiconductor device. If it is assumed that the semiconductor device (e.g., the test object) has a rectangular shape, one side surface of the semiconductor device may be properly in contact, but the other side surface may not be properly in contact. To prevent this, FIGS. 4 to 16 illustrate an example in which the outer blade conductors, the outer socket conductors, and the test signal transferring portions are respectively disposed on edges or corners, forming a rectangular shape. However, exemplary embodiment are not limited thereto.

For example, when the outer blade conductors include first to Mth outer blade conductors (M is an integer equal to or greater than two), the outer socket conductors may also include first to Mth outer socket conductors, and the test signal transferring portions formed on the test board may also include first to Mth test signal transferring portions.

Referring to the example in which, after the test signal transferred through the test board 300 passes through the socket 200 and reaches the blade 100 and the test signal passes through the socket 200 again and returns to the test board (see FIGS. 15 and 16), the first to Mth test signal transferring portions may each include a signal transmitting portion that transmits a test signal to the first to Mth outer socket conductors, and a signal receiving portion that receives the test signal from the first to Mth outer socket conductors. Thus, the number of signal transmitting portions and the number of the signal receiving portions formed on the test board 300 may be M.

In the description below, two examples of a method of testing whether the elements are in contact with one another will be described.

Figure 18:
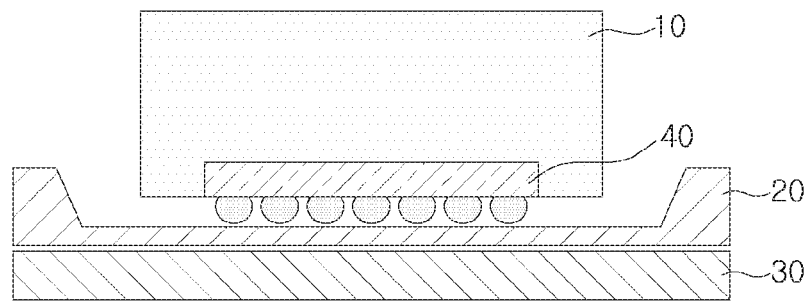
FIG. 18 is a side view illustrating a structure of a device for testing a semiconductor device according to a comparative example.
Figure 19:
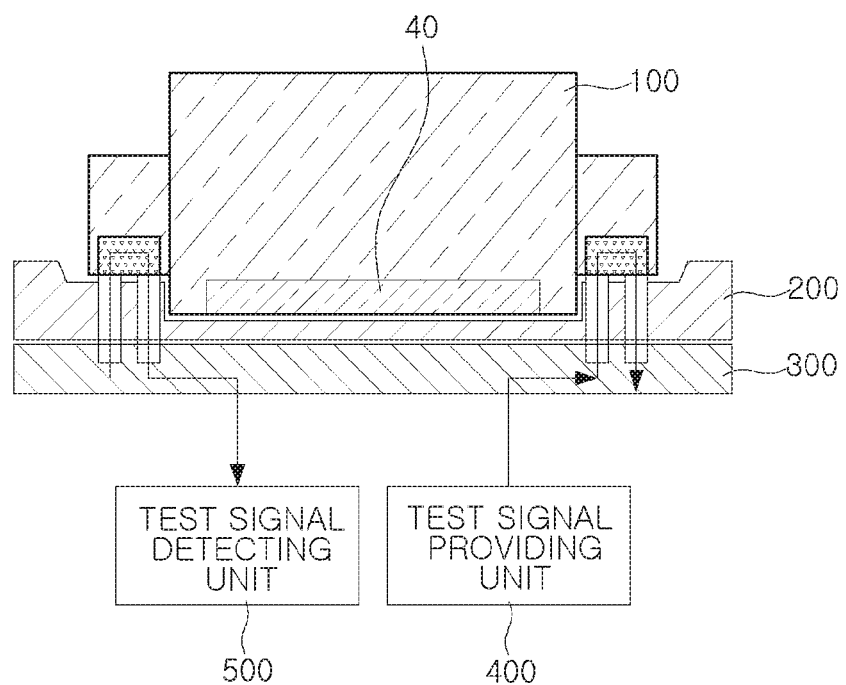
FIG. 19 is a side view illustrating movement of a test signal of a device for testing a semiconductor device according to an exemplary embodiment.
Figure 20:
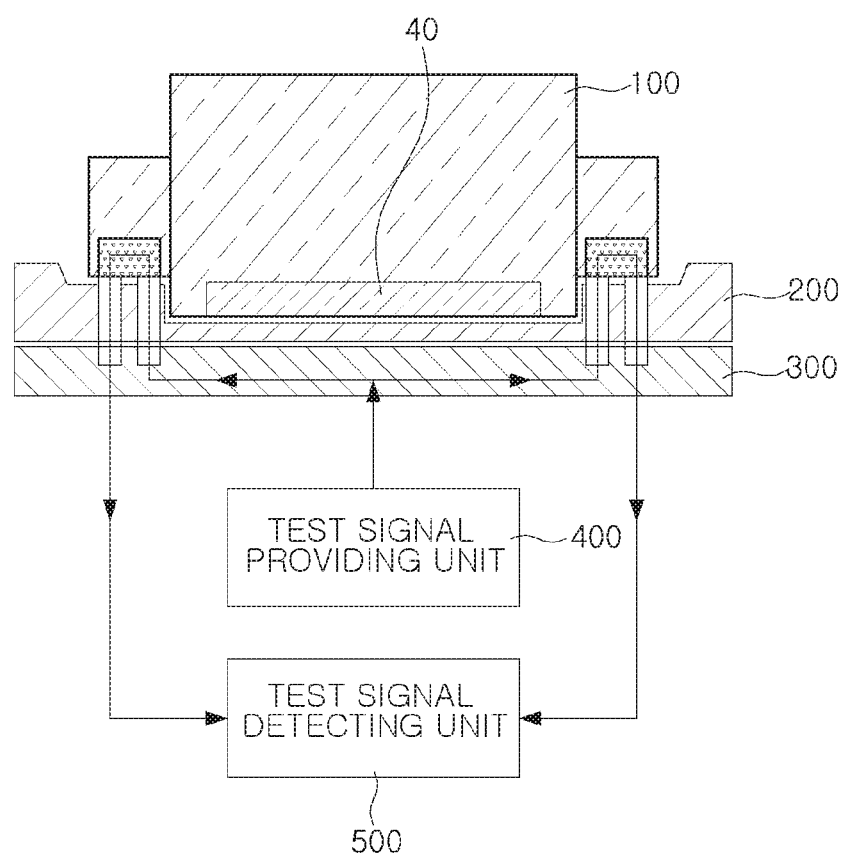
FIG. 20 is a side view illustrating movement of a test signal of a device for testing a semiconductor device according to an exemplary embodiment.

FIG. 18 is a side view illustrating a structure of a device for testing a semiconductor device according to a comparative example. FIG. 19 is a side view illustrating movement of a test signal of a device for testing a semiconductor device according to an exemplary embodiment. FIG. 20 is a side view illustrating movement of a test signal of a device for testing a semiconductor device according to an exemplary embodiment.

As an example, a signal transmitting portion of a first test signal transferring portion may be electrically connected to a test signal providing unit, a signal receiving portion of an M−1th test signal transferring portion may be connected to a signal transmitting portion of an Mth test signal transferring portion, and a signal receiving portion of the Mth test signal transferring portion may be electrically connected to a test signal detecting unit.

Referring to the examples illustrated in FIGS. 11, 12, 15, and 19, a test signal provided from a test signal providing unit 400 may be transferred to one of signal transmitting portions 311 and 361 formed on a test board 300. If the elements are properly in contact with one another, after the test signal passes through a socket 200 and a blade 100, the test signal may pass through the socket 200 again and may be transferred to signal receiving portions 313 and 363 on the test board 300, as illustrated in FIG. 19. The test signal transferred to the signal receiving portions 313 and 363 may be transferred to signal transmitting portions 321 and 371 disposed in different positions in accordance with a design of wires formed on the test board 300, and thereafter, the test signal may pass through the socket 200, the blade 100, and the socket 200 again, and may return to the test board 300. The processes described above may be further performed from each of signal transmitting portions 331, 341, 381 and 391 to each of signal receiving portions 333, 343, 383 and 393. As a result, the processes described above may be performed four times for each test board 300 and 300', and the test signal may be transferred to the test signal detecting unit 500. The test signal detecting unit 500 may detect whether the test signal provided from the test signal providing unit 400 is received.

As another example, the signal transmitting portions of the first to Mth test signal transferring portions may be electrically connected to the test signal providing unit 400, and the signal receiving portions of the first to Mth test signal transferring portions may be electrically connected to the test signal detecting unit 500.

Referring to FIGS. 13, 14, 16, and 20, the test signal provided from the test signal providing unit 400 may be transferred to the signal transmitting portions (the signal transmitting portions 315, 325, 335, and 345 in FIG. 13; the signal transmitting portions 365, 375, 385, and 395 in FIG. 14) formed on the test board 300. If the elements are properly in contact with one another, after the test signal passes through the socket 200 and the blade 100, the test signal may pass through the socket 200 again and may be transferred to the signal receiving portions (the signal receiving portions 317, 327, 337, and 347 in FIG. 13; the signal receiving portions 367, 377, 387, and 397 in FIG. 14), as illustrated in FIG. 20. The test signal transferred to the signal receiving portions may be transferred to the test signal detecting unit 500. The test signal detecting unit 500 may detect whether the test signal provided from the test signal providing unit 400 is received.

Referring to the exemplary embodiments, to transmit the test signal to the blade 100, the socket 200, and the test board 300, the above described individual elements may be added to each element illustrated in FIG. 18, as illustrated in FIGS. 19 and 20, and the test for the semiconductor device 40 may be performed more accurately and more efficiently.

The test handler according to exemplary embodiments may include a blade movable from a first position to a second position, and outer blade conductors formed on least one side surface of the blade. The test handler may be configured such that, while the blade is moved from the first position to the second position, the outer blade conductors determine whether a test process is continued, depending on whether a test signal is transferred from outer socket conductors formed on outer regions of a socket. The test signal provided to the outer socket conductors is provided from a test board.

The test handler according to exemplary embodiments may further include a test signal detecting unit 500 that detects whether the test signal reaches the outer blade conductors, as illustrated in the exemplary embodiment of FIG. 17.

Alternatively, as illustrated in FIGS. 15 and 16, the test handler may further include the test signal detecting unit 500 that detects whether, after the test signal provided to the outer socket conductors reaches the outer blade conductors, the test signal passes through the outer socket conductors again and reaches the test board.

The test handler described above may be the same as that with reference to the examples illustrated in FIGS. 4 to 20, and thus, a further detailed description thereof will not be repeated.

Figure 21:
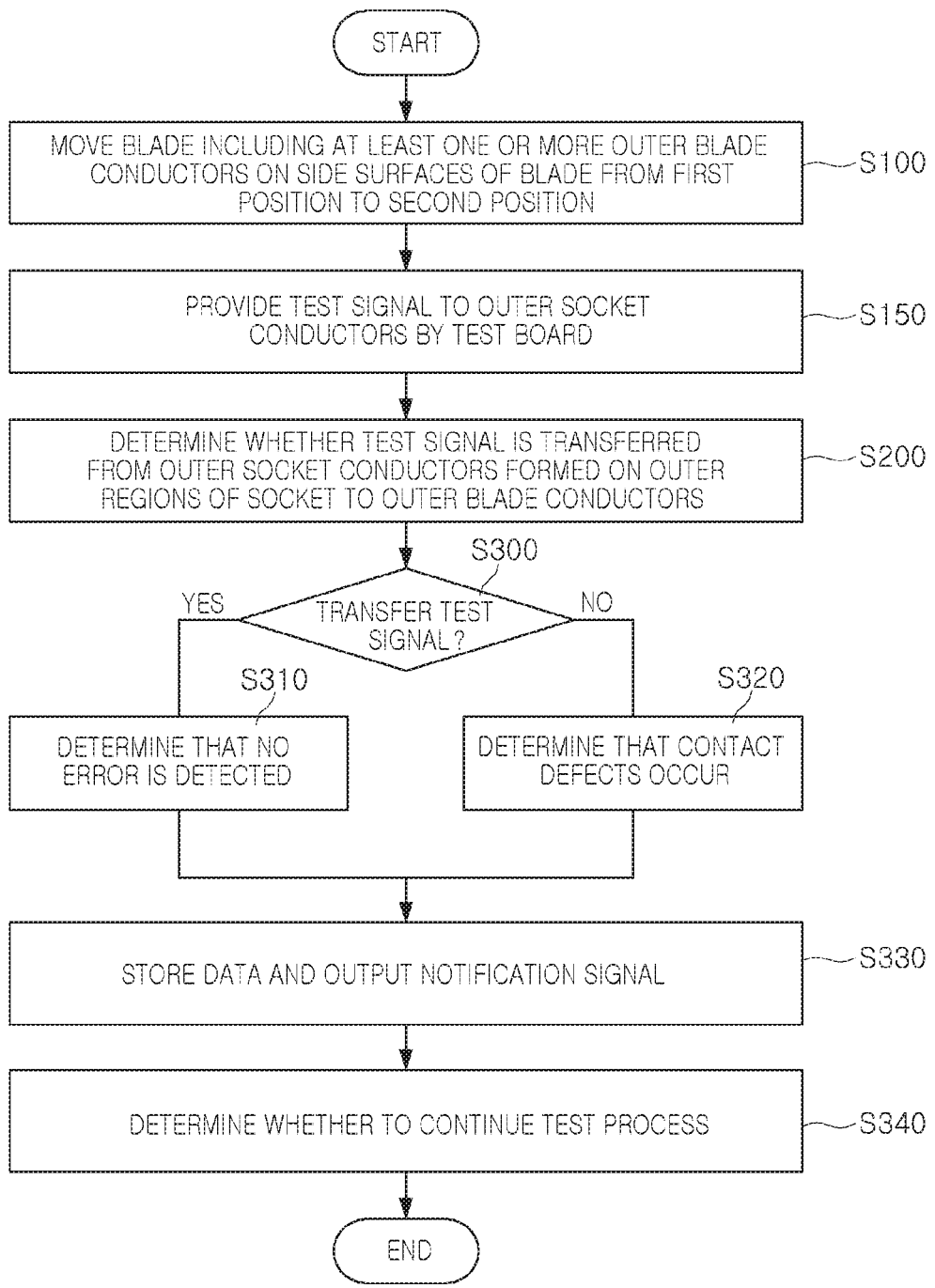
FIG. 21 is a flowchart illustrating a method of testing a semiconductor device according to an exemplary embodiment.
Figure 22:
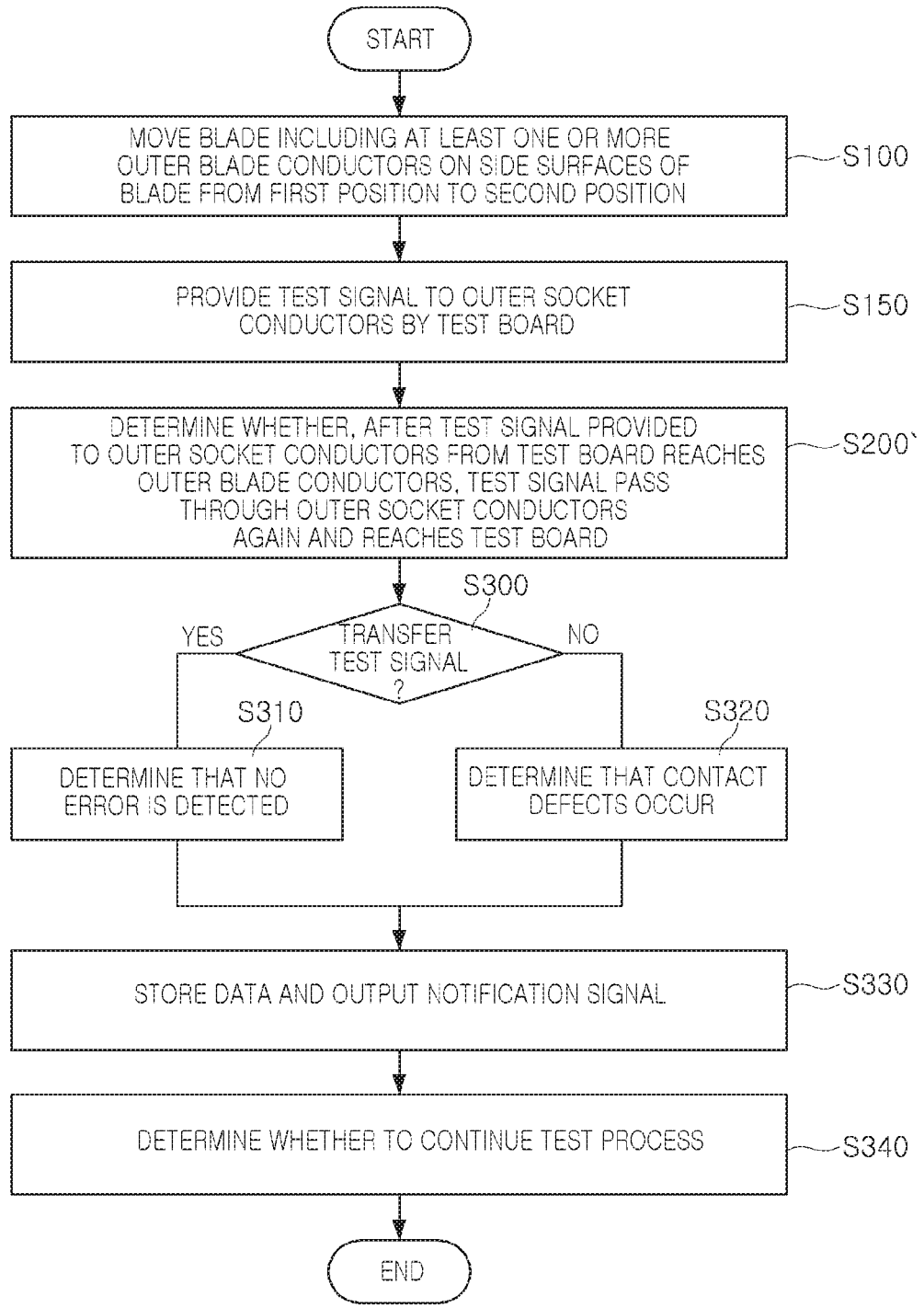
FIG. 22 is a flowchart illustrating a method of testing a semiconductor device according to an exemplary embodiment.

FIG. 21 is a flowchart illustrating a method of testing a semiconductor device according to an exemplary embodiment. FIG. 22 is a flowchart illustrating a method of testing a semiconductor device according to an exemplary embodiment.

A method of testing a semiconductor device according to exemplary embodiments may include a process of moving a blade including at least one or more outer blade conductors disposed on side surfaces of the blade from a first position to a second position (S100), a process of determining whether a test signal is transferred from outer socket conductors formed on outer regions of a socket to the outer blade conductors (S200), and processes of determining that no error is detected when the test signal is transferred (S300 and S310). The above described processes may correspond to the exemplary embodiment illustrated in FIG. 17, and the detailed description of the exemplary embodiment may be the same as the description of the example illustrated in FIG. 17, and thus, a further detailed description thereof will not be repeated.

Before the process S200, the method may further include a process of transferring the test signal to the outer socket conductors by a test board (S150). FIG. 20 illustrates the example in which the process S150 may be performed after the process S100, however, exemplary embodiments are not limited thereto. The process S150 may also be performed before the process S100.

As another example, the process S200 described above may be replaced by a process of determining whether, after the test signal provided to the outer socket conductors from the test board reaches the outer blade conductors, the test signal passes through the outer socket conductors again and is transferred to the test board (S200') (see FIG. 22). The process may correspond to the exemplary embodiment illustrated in FIGS. 15 and 16, and the detailed description of the exemplary embodiment may be the same as the description of the examples illustrated in FIGS. 15 and 16, and thus, a further detailed description thereof will not be repeated.

The method of testing a semiconductor device may be configured such that whether the test signal is transferred in the process S300 may be determined, and if the test signal is not transferred (N), it may be determined that defects occur in the contacts between the elements (S320). Arrangement information of the semiconductor device (e.g., the test object), information on a position in which the contact defects occur, etc., may be stored, and a signal for notifying that the defects occur may be output (S330). Whether to continue the test process may be determined depending on a result of the determination obtained in the process S300 (S340).

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

According to the exemplary embodiments described above, a device for testing a semiconductor device, a method of testing a semiconductor device, and a test handler capable of efficiently checking a state of contact between the device and a test board in a process of manufacturing the semiconductor device may be provided.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A device for testing a semiconductor device, comprising:
    a blade comprising one or more outer blade conductors disposed on one or more side surfaces of the blade;
    a socket comprising one or more outer socket conductors disposed on one or more side surfaces of the socket,
    wherein the one or more outer socket conductors are disposed at a location such that they are in contact with or are isolated from the one or more outer blade conductors depending on a position of the blade; and
    a test board that transfers a test signal to the one or more outer socket conductors,
    wherein the blade has a rectangular shape, and the one or more outer blade conductors are formed on at least two or more edges among four edges forming the rectangular shape or on two or more corners among four corners forming the rectangular shape.

2. The device of claim 1, further comprising:
    a test signal providing circuit that provides a test signal to the test board while the blade is moved from a first position to a second position; and
    a test signal detecting circuit that detects whether the test signal provided from the test signal providing circuit reaches the one or more outer blade conductors.

3. The device of claim 2,
    wherein the blade has a cross-sectional surface having the rectangular shape taken in a direction perpendicular to a direction in which the blade is moved from the first position to the second position.

4. The device of claim 1,
    wherein each of the one or more outer socket conductors comprises a first sub-conductor and a second sub-conductor isolated from each other,
    wherein the first sub-conductor receives a test signal from the test board, and the second sub-conductor provides the test signal to the test board.

5. The device of claim 4,
wherein the test board comprises one or more test signal transferring portions, each comprising a signal transmitting conductor and a signal receiving conductor,
wherein the signal transmitting conductor transmits the test signal to the one or more outer socket conductors, and the signal receiving conductor receives the test signal from the one or more outer socket conductors.

6. The device of claim 5, further comprising:
a test signal providing circuit that provides the test signal to the signal transmitting conductor while the blade is moved from a first position to a second position; and
a test signal detecting circuit that detects whether the test signal provided from the test signal providing circuit reaches the signal receiving conductor.

7. The device of claim 1, wherein the one or more outer blade conductors are selectively removable from the blade.

8. The device of claim 1,
wherein the one or more outer blade conductors comprise first to Mth outer blade conductors,
wherein the one or more outer socket conductors comprise first to Mth outer socket conductors,
wherein the test board comprises first to Mth test signal transferring portions that transfer the test signal to or receive the test signal from the first to Mth outer socket conductors,
wherein M is an integer equal to or greater than 2.

9. The device of claim 8, wherein each of the first to Mth test signal transferring portions comprises a signal transmitting conductor that transmits the test signal to the first to Mth outer socket conductors, and a signal receiving conductor that receives the test signal from the first to Mth outer socket conductors.

10. The device of claim 9, further comprising:
a test signal providing circuit that provides the test signal to the test board while the blade is moved from a first position to a second position; and
a test signal detecting circuit that detects whether the test signal provided from the test signal providing circuit reaches the one or more outer blade conductors.

11. The device of claim 10,
wherein the signal transmitting conductor of the first test signal transferring portion is electrically connected to the test signal providing circuit,
wherein the signal receiving conductor of the M−1th test signal transferring portion is electrically connected to the signal transmitting conductor of the Mth test signal transferring portion,
wherein the signal receiving conductor of the Mth test signal transferring portion is electrically connected to the test signal detecting circuit.

12. The device of claim 10,
wherein the signal transmitting conductors of the first to Mth test signal transferring portions are electrically connected to the test signal providing circuit,
wherein the signal receiving conductors of the first to Mth test signal transferring portions are electrically connected to the test signal detecting circuit.

13. A test handler, comprising:
a blade movable from a first position to a second position; and
one or more outer blade conductors formed on at least one side surface of the blade,
wherein, while the blade is moved from the first position to the second position, the one or more outer blade conductors indicate whether a test process is continued, depending on whether a test signal is transferred from one or more outer socket conductors formed on outer regions of a socket,
wherein the blade has a rectangular shape, and the one or more outer blade conductors are formed on at least two or more edges among four edges forming the rectangular shape or on two or more corners among four corners forming the rectangular shape.

14. The test handler of claim 13, wherein the test signal provided to the outer socket conductors is provided from a test board.

15. The test handler of claim 14, further comprising:
a test signal detecting circuit that detects whether the test signal reaches the one or more outer blade conductors.

16. The test handler of claim 14, further comprising:
a test signal detecting circuit that detects whether, after the test signal provided to the one or more outer socket conductors reaches the outer blade conductors, the test signal passes through the one or more outer socket conductors again and reaches the test board.

17. The test handler of claim 13, wherein the one or more outer blade conductors are selectively removable from the blade.

18. A method of testing a semiconductor device, comprising:
a first process of moving a blade comprising one or more outer blade conductors disposed on one or more side surfaces of the blade from a first position to a second position,
wherein the blade has a rectangular shape, and the one or more outer blade conductors are formed on at least two or more edges among four edges forming the rectangular shape or on two or more corners among four corners forming the rectangular shape;
a second process of determining whether a test signal is transferred from one or more outer socket conductors formed on one or more outer regions of a socket to the one or more outer blade conductors; and
a third process of determining whether an error is detected based on whether the test signal is transferred from the one or more outer socket conductors to the one or more outer blade conductors.

19. The method of claim 18, further comprising:
a fourth process of transferring the test signal to the one or more outer socket conductors by a test board before the second process.

20. The method of claim 19, wherein the second process further comprises a fifth process of determining whether, after the test signal provided to the one or more outer socket conductors from the test board reaches the one or more outer blade conductors, the test signal passes through the one or more outer socket conductors again and is transferred to the test board.

* * * * *